MICROWAVE NEGATIVE RESISTANCE AVALANCHE DIODE

Filed Jan. 27, 1967 3 Sheets-Sheet 1

INVENTORS
CHARLES A. BITTMANN
HEINZ RUEGG
BY [signature]
[signature]
ATTORNEYS

INVENTORS
CHARLES A. BITTMANN
HEINZ RUEGG
BY Norman N. Kunitz
Roger S. Borovoy
ATTORNEYS INVENTORS
CHARLES A. BITTMANN
HEINZ RUEGG
BY Norman N. Kunitz
Roger A. Borovoy
ATTORNEYS United States Patent Office 3,493,821
Patented Feb. 3, 1970

3,493,821
MICROWAVE NEGATIVE RESISTANCE AVALANCHE DIODE

Charles A. Bittmann, Los Altos, and Heinz Ruegg, Palo Alto, Calif., assignors to Fairchild Camera and Instrument Corporation, Syosset, N.Y., a corporation of Delaware Filed Jan. 27, 1967, Ser. No. 612,236
Int. Cl. H01l *3/00, 5/00, 11/00*
U.S. Cl. 317—234 17 Claims

ABSTRACT OF THE DISCLOSURE

A three layer "planar" microwave negative resistance diode having the desirable sharply peaked electric field distribution of the conventional four layer Read diode when the diode is reverse biased into avalanche. Enhancement of the field at the avalanche region to produce the desired peak is due to the geometry of the P-N junction which is substantially curved along its entire surface and has a relatively small radius of curvature.

This invention relates to an improved microwave negative resistance avalanche semiconductor diode and more particularly, to an improved diode for use in high frequency oscillators and amplifiers.

In U.S. Patent 2,899,652, issued Aug. 11, 1959, to W. T. Read for a "High-Frequency Negative Resistance Diode," it is proposed that a high frequency negative resistance could be produced by reverse biasing into avalanche the P-N junction of a specially designed semiconductor diode. This diode is designed in such a way that the charge carriers generated by the avalanche multiplication tend to drift through the depletion region formed near the P-N junction of the diode with a finite transit time. The width of the depletion region in the proposed diode, and hence the transit time of the carriers, is such that the total phase difference between the voltage and current involved in the avalanche and in the drift of the carriers through the depletion region is between 90° and 270° (preferably 180°) for the operating frequency of the diode. Maintaining the phase difference between these values makes possible negative resistance amplification at the operating frequency of the diode and oscillations when the diode is connected in a resonant circuit. The basic structure proposed in the patent is a $P^+N^-N^+$ structure or its converse, where the + and − denote high and low impurity (or doping) concentration, respectively. In such a structure, however, avalanche breakdown takes place throughout the entire depletion region or a large portion thereof. Therefore, the current in the depletion region consists of both electrons and holes moving in opposite directions. The resultant separate transit time for both holes and electrons through the depletion region makes such a device rather inefficient. To improve the efficiency of the device, Read proposed that the high field avalanche region of the device be spacially separated from the lower field drift or transit time region so that avalanche breakdown can be confined to a very narrow portion near the P-N junction at one edge of the depletion region of the diode. In order to achieve this result, Read proposed that the structure take the form of a $P^+NIN^+$ (or conversely a $N^+PIP^+$) diode (where I denotes semiconductor material of intrinsic conductivity), or, due to the impracticality of attaining actual intrinsic material, a $P^+NN^-N^+$ (or conversely a $N^+PP^-P^+$) structure. This preferred four layers device, having a desired field distribution which sharply peaks at the avalanche region, is more efficient than the basic three layer device. The preferred embodiment of such a negative resistance device is conventionally referred to as a Read diode.

Although this four layer structure was suggested by Read in 1954, it was exceedingly difficult to fabricate. Actual operation was not achieved until 1965, at which time a diode was made using mesa techniques. Even today, although such a structure can be obtained using planar techniques by judicious doping selection in a double-diffused epitaxial device, the manufacturing process proves to be extremely difficult for epitaxial thicknesses smaller than about 10 microns for the $N^-$ or I region of the device. This difficulty arises from the requirement that the $N^-$ or I region be approximately 10 times as thick as the N region in order to have a properly operating device. Hence, devices having $N^-$ or I regions smaller than 10 microns require the accurate control of the doping concentration of thicknesses smaller than 1 micron, a procedure which is extremely difficult with the present state of the art technology. Since the thickness of the $N^-$ or I region determines the operating frequency of the diode, this difficulty limits the operating frequencies of such diodes to approximately 6 gHz.

The instant invention overcomes the problems in the fabrication of the conventional Read diode by controlling the geometry of the basic diode structure proposed by Read, i.e., the $P^+N^-P^+$ or $N^+P^-P^+$ structure, to limit the avalanche breakdown to a small region adjacent the P-N junction and obtain the favorable or desired field distribution realized with the four layer Read structure. Briefly, the diode structure according to the invention comprises a semiconductor substrate of relatively high conductivity and of a first conductivity type (e.g., $N^+$) having a layer, typically epitaxially grown, of the same conductivity type but of a relatively high resistivity (e.g., $N^-$) overlying a major surface thereof. A highly conductive region of semiconductor material of opposite conductivity type is formed within said layer adjacent the exposed substantially flat surface thereof and forms a "planar" type P-N junction with the layer, i.e., the junction extends to the exposed surface of the layer. Ohmic contacts are provided for the substrate and for the opposite conductivity type region. The structure according to the invention differs from the basic Read structure or from conventional diodes with either plane or planar type junctions in that the junction formed in the diode according to the invention is a "planar" type junction which has a substantially curved configuration, i.e., the flat or plane portion of the junction is minimized, so that the capacitance of the junction is minimized. This allows the resulting diode to operate at much higher frequencies. The field concentration necessary for avalanche breakdown is achieved by making the radius of curvature of the junction very small in order to concentrate the field. The radius of curvature of the junction is also made small with respect to the thickness of the high resistivity layer whereby the field distribution in the diode when it is reverse biased is similar to that for the Read diode. This field sharply peaks at the junction or avalanche region of the diode and then decays through the drift region (remainder of the depletion region). According to the preferred embodiments of the invention, the plane portion of the junction is eliminated by forming the junction so that its shape is semi-cylindrical, semi-toroidal, or hemi-spherical.

The invention and the advantages thereof will be more clearly understood from the following detailed description taken in conjunction with the drawings wherein.

Figures 1, 2:
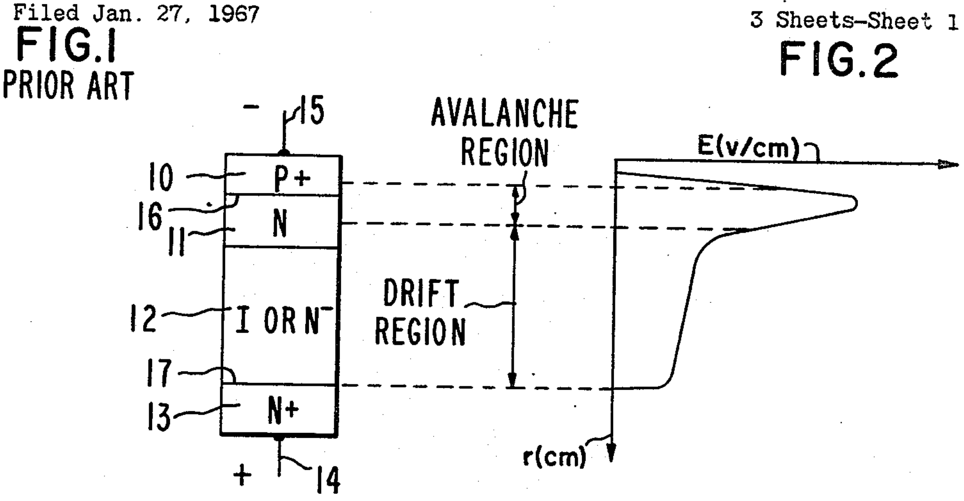
FIG. 1 PRIOR ART, FIG. 2
FIG. 1 is a cross-sectional view of the standard Read diode.
FIG. 2 is a curve illustrating the field distribution of the diode of FIG. 1.

Referring now to FIG. 1, there is shown the preferred diode proposed by Read in his above mentioned patent comprising four consecutive semiconductor regions 10, 11, 12, and 13 which as illustrated are of conductivity types $P^+$, N, $N^-$, and $N^+$ respectively. It is of course understood that if desired, regions 10–13 could be of the conductivity type $N^+$, P, $P^-$, and $P^+$ respectively. When such a diode is reverse biased by means of an applied voltage, as indicated by the plus (+) and the minus (−) at terminals 14 and 15 respectively, a space charge depletion layer is established which extends from the P-N junction 16 formed between the regions 10 and 11 to the junction 17 formed at the interface of the regions 12 and 13. The resultant electric field distribution in the diode under reverse bias is indicated in FIG. 2. As is obvious from this curve, the resultant field has its maximum value in the vicinity of the P-N junction 16 and it is in this region that avalanche breakdown occurs when a critical field is reached. In the device, a sharply peaked field distribution is obtained by forming the junction with a steep dopant concentration profile by proper doping in the region 10 and 11. This causes the avalanche breakdown to be confined to a very narrow region near the junction. When the critical field is reached, of the order of several hundred kilovolts per centimeter, hole-electron pairs are generated in the vicinity of the P-N junction by internal secondary emission (also called avalanche or multiplication) and the diode current becomes large. The holes produced drift immediately into the $P^+$ region 10, whereas the electrons tend to move toward the region 13 through the high resistivity region 12. Since the field throughout the depletion region is in the range where carriers move with maximum velocity independent of the field (above about 20 kilovolts per centimeter) the electrons drift toward the high conductivity region 13 at a constant velocity. As indicated, the region 12 as well as the portion of region 11 not adjacent junction 16 is often referred to as the drift region.

In operation, the diode is reverse biased so that an A.C. signal superimposed thereon, for example, by a resonant circuit when the device is used in an oscillator, causes the field at the P-N junction to rise above the critical field during one-half cycle of the A.C. signal and fall below the critical field during the other half cycle. The current which is generated at the P-N junction hence builds up during the half cycle when the field at the junction is above the critical value and decays during the remainder of the cycle. This generated current is out of phase with and lags the applied voltage. Moreover, because the electrons which are generated by the avalanche and which form this generated current tend to drift through the drift region with a finite transit time, the current through the device becomes further out of phase in a lagging direction with the applied voltage. Accordingly, in order to produce a desired phase shift between the current and voltage, the width of the drift region is adjusted by varying the thickness of the high resistivity region 12 so that the transit time of the electrons across the drift region is such that the phase shift is between 90° and 270°, thus causing the device to exhibit a negative resistance. For maximum efficiency of operation, i.e., for maximum power output, it is desirous that the current through the device or output current be out of phase by 180° with the applied voltage.

As mentioned above, although this diode was proposed in 1954, because of the difficulty in providing the proper junction profile, no practical embodiments were obtained until 1965 at which time a mesa type structure was described in an article entitled "The Read Diode-An Avalanching Transit Time Negative Resistance Oscillator," Applied Physics Letters, volume 6, 1965, pages 89–91. Since that time, Read diodes using planar type technology requiring the double diffusion have been fabricated. However, the processing required for such diodes is also extremely complicated and tedious due to the requirements for the doping of the junction. Moreover, since in this type of diode the frequency at which it will operate is limited by the thickness of the drift region, problems occur as the desired operating frequency in the devices increases because of the thinner high resistance or drift regions and hence, the thinner avalanche regions required.

Figures 3, 4, 5:
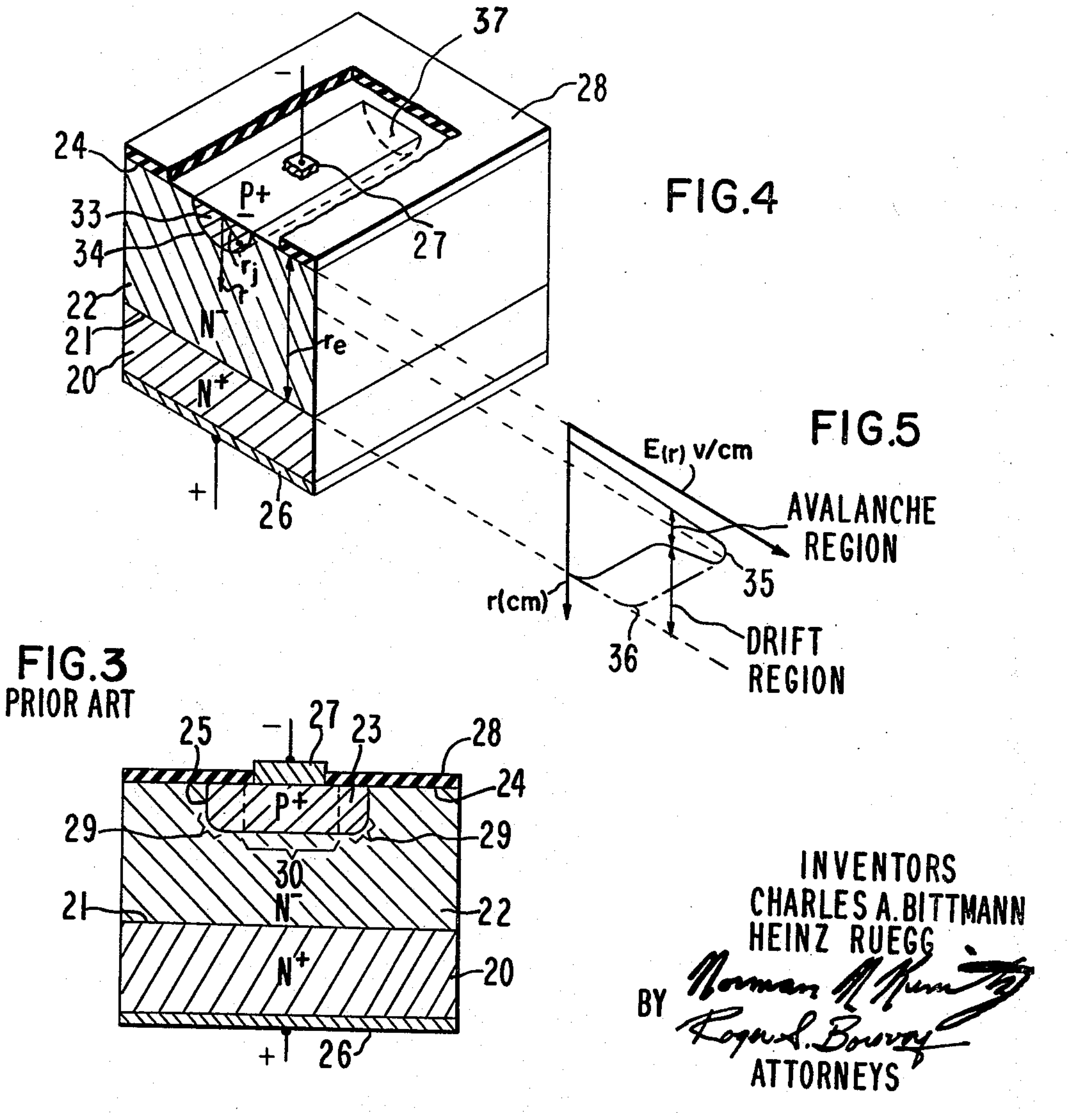
FIG. 3 PRIOR ART, FIG. 4, FIG. 5
FIG. 3 is a cross-sectional view of a standard planar type diode.
FIG. 4 is an isometric view, partially in section, showing the diode of FIG. 3 modified acording to the invention.
FIG. 5 is a graph comparing the field distribution of the structure of FIG. 4 with that of the basic diode structure proposed by Read.

The problems inherent in the prior art double diffused planar processing of conventional type Read diodes are overcome by the diode constructed according to the invention which can be manufactured by standard planar techniques requiring only a single diffusion. The construction, according to the invention, consists essentially of a high resistivity region between two highly conductive regions of oppoiste conductivity type, with the junction formed at the interface of the high resistivity region and one of the highly conductive regions having a contour which will enhance the field at the junction of the diode when it is reverse biased. Before describing the specific construction of the diode according to the invention, a brief description of the basic three-layer structure proposed by Read and constructed using conventional planar processing is believed helpful. Such a three-layer structure is shown in FIG. 3 which is a cross-sectional view of a standard planar device of symmetrical geometry. The device consists essentially of a substrate 20 of semiconductor material, for example, monocrystalline silicon, germanium, III–V compounds, etc., having a first conductivity type (N-type) as indicated. The substrate 20 is formed so that it is highly conductive by providing the semiconductor material with a high concentration of the characteristic impurity (indicated by the plus). For example, the substrate 20 should have a sufficient concentration of dopant atoms, e.g., $10^{16}$ to $10^{20}$ atoms per $cm.^3$ so that its resistivity is approximately .50 to 0.001 ohms-centimeter. Overlying the surface 21 of the substrate 20 is a layer 22 of semiconductor material of the same conductivity type as that of the substrate, but of a relatively high resistivity, i.e., a low impurity concentration as indicated by the minus. For example, the layer 22, which may be formed by standard epitaxial growth methods, should have an impurity concentration which is not greater than a few times $10^{14}$ atoms per cubic centimeter. Such impurity concentrations will result in resistivities which are greater than approximately 10 ohms-centimeter for N-type material and approximately 25 ohms-centimeter for P-type material. A highly conductive region 23 of the opposite conductivity type is formed, for example, by standard solid state diffusion techniques, within the layer 22 adjacent the surface 24 thereof. The region 23 which is also a highly conductive region, for example, having a surface concentration of between $10^{18}$ to $10^{20}$ or higher atoms per $cm.^3$, forms a P-N junction 25 with the region 22 which junction extends to the surface 24. Ohmic electrical contacts, for example, metal layers 26 and 27, are provided for the regions 20 and 23 of the diode respectively. A protective layer of insulating material 28, e.g., a silicon oxide in the case of a silicon device, is provided over the remainder of the surface 24.

As indicated in FIG. 3 of the drawings, any conventional "planar" type diffused junction consists essentially of a curved portion 29 and a flat or plane portion 30. As is well-known in the semiconductor technology, the curved portion of a planar diffused junction causes a concentration of the adjacent electrical field, and hence, breakdown of such a junction occurs initially at the curved portion. Accordingly, when such a diode is reverse biased into avalanche breakdown, the net result is that of an active curved diode (portion 29) biased into avalanche which is shunted by a plane diode (portion 30) biased below avalanche. In this condition, the plane portion of the diode only adds capacitive loading to the circuit and thus decreases the maximum available output power. Moreover, the relatively large capacitive loading seriously limits the maximum operating frequency of the diode. It is for these latter two reasons that the conventional single diffused planar diode structure shown in FIG. 3 is not desirable as a practical microwave negative resistance diode. The instant invention in its broadest aspects, provides a novel structure whereby the plane portion of the conventional planar type diffused junction is minimized so that the large capacitive reactance caused thereby is also minimized. More particularly, the invention provides a diode having a junction structure whereby the ratio of the surface area of the curved portion of the junction of the junction to the surface area of any plane portion of the junction is maximized.

Referring now to FIG. 4, there is shown an embodiment of a diode according to the invention having a semi-cylindrical shaped junction. In this figure and in all succeeding figures, portions of the diode which are the same as those shown in FIG. 3 are referred to by the same reference numeral. In this construction, the symmetrical high conductivity P-type region 23 is replaced by a region 33 which has the same conductivity type characteristics as region 23, but is semi-cylindrical shaped. That is, the junction 34 formed between the region 33 and the region 22 is curved along substantially its entire surface, and has a very small radius of curvature, i.e., less than 4 microns. Such a junction may be formed, for example, by diffusing the impurity used to form the region 33 through a very narrow slit, for example, 1 micron wide, in the diffusion mask, and diffusing the junction down to a depth of approximately 1 micron to form a junction with a radius of curvature of 1 micron or to a depth of 3 microns for a 3 micron radius of curvature. Although in actual practice, such a junction will have a slight plane portion, for all practical purposes, the plane portion is so small that the junction may be considered as truly cylindrical. This is particularly true as the radius of curvature approaches the maximum desired values.

Turning now to the theoretical considerations of a diode constructed as shown in FIG. 4, Poisson's equation for a cylindrical junction is as follows:

$$\nabla_r E(r) = qN/\epsilon r$$

where:

N=the net doping density in the depletion region;
$q$=electronic charge;
E=electric field;
$\epsilon$=the dielectric constant$=1.06\times10^{-12}$ farads per centimeter for silicon; and,
$r$=the radial distance from cylinder axes.

This equation may be reduced to the following form for conditions when $r$ is greater than $r_j$ but less than $r_e$ where $r_j$ is the radius of curvature of the junction, and $r_e$ is the thickness of the layer 22:

$$|E(r)| = \left[E(r_e) + \frac{qN}{2\epsilon} r_e\right]\frac{r_e}{r} - \frac{qN}{2\epsilon} r \qquad (2)$$

The field E($r$) in the breakdown region ($r \ll r_e$) is much larger for a reasonably high (less than $10^{16}$ impurity atoms per cc.) resistivity material in the region 22 then the term $$\frac{qN}{2\epsilon} r$$

in Equation 2 above. Hence, this term can be neglected and the equation reduces to the following form:

$$|E(r)| \approx \left[E(r_e) + \frac{qN}{2\epsilon} r_e\right]\frac{r_e}{r} \qquad (3)$$

As is evident from Equation 3, the field is only a function of $r_e/r$. Therefore, the field profile or distribution, which as shown by the solid line curve 35 in FIG. 5 is similar to that for a conventional Read diode, is independent of the thickness of the layer 22 or of any single layer. Consequently, the layer 22 may be made as thin as necessary, e.g., between 2–30 microns, to provide the desired phase shift at the particular frequency at which it is desired to operate a diode constructed in this manner. Hence, devices having the semi-cylindrical junction can be made to operate at frequencies much higher than those presently obtainable with the conventional Read diode. For comparison purposes, the field distribution of a three layer diode such as suggested by Read is shown by the dashed line curve 36 in FIG. 5. As can easily be seen, this latter field distribution curve does not have the desired sharp peak near the junction but rather decays linearly across the drift region.

It should be noted that although the three-layer diode proposed by Read and shown in FIG. 3 requires that the impurity concentration of the region 22 be no greater than a few times $10^{14}$ atoms per cm.$^3$, such as not the case for a diode structure according to the invention. Although a diode constructed as in FIG. 4 will, for all practical applications, operate properly with this upper limit for the impurity concentration at the higher operating frequencies, e.g., about 20 gHz., the impurity concentration need not be limited to this value. Because of the shape of the field distribution curve of the device according to the invention, at the higher operating frequencies wherein very small thicknesses, e.g., 2 microns, for $r_e$ are needed, the impurity concentration is not very critical. This is due to the fact that even with a higher conductivity, and therefore a reduced resistivity, for the region 22, the field distribution will still be determined by the geometry or curvature of the junction as long as region 22 is very thin and, therefore, the desired field peaking will still be attained. Hence, impurity concentrations as high as a few times $10^{15}$ or even $10^{16}$ atoms per cm.$^3$ may be used for the region 22.

Although, as indicated above, the field profile is not dependent solely on the thickness ($r_e$) of the layer 22 nor on a steep impurity concentration profile, the phase shift (and hence the frequency of operation) of the device is still a function of $r_e$, while proper peaking of the field is a function of the ratio of $r_e$ to the radius of curvature ($r_j$) of junction 34. In order to arrive at an approximate relationship between the radius of curvature of the junction and the thickness of the region 22, various other parameters in the field equation must be considered. The dimensions of a semi-cylindrical diode may be determined by the following considerations:

(1) As in the case of Read diode, the length of the drift region determines the optimum frequency of oscillation. For all practical cases, the length of the drift region is approximately equal to the thickness of region 22 ($r_e$). In order to optimize, i.e., 180° phase difference, a device for operation at a frequency $f_0$, the transit time through the drift region should be approximately equal to one-half of the period of oscillation, $1/2f_0$. The thickness of region 22 therefore is given in terms of the desired operating frequency $f_0$ as $$r_e \approx v_{max}/2f_0$$

where $v_{max}$ is the maximum, field-independent drift velocity of the charge carriers. For a typical value of $v_{max} \approx 10^7$ centimeters per second, $r_e$ should be 10 microns for an operating frequency of 5 gHz., 5 microns for 10 gHz., 2.5 microns for 20 gHz., etc.

Figure 6:
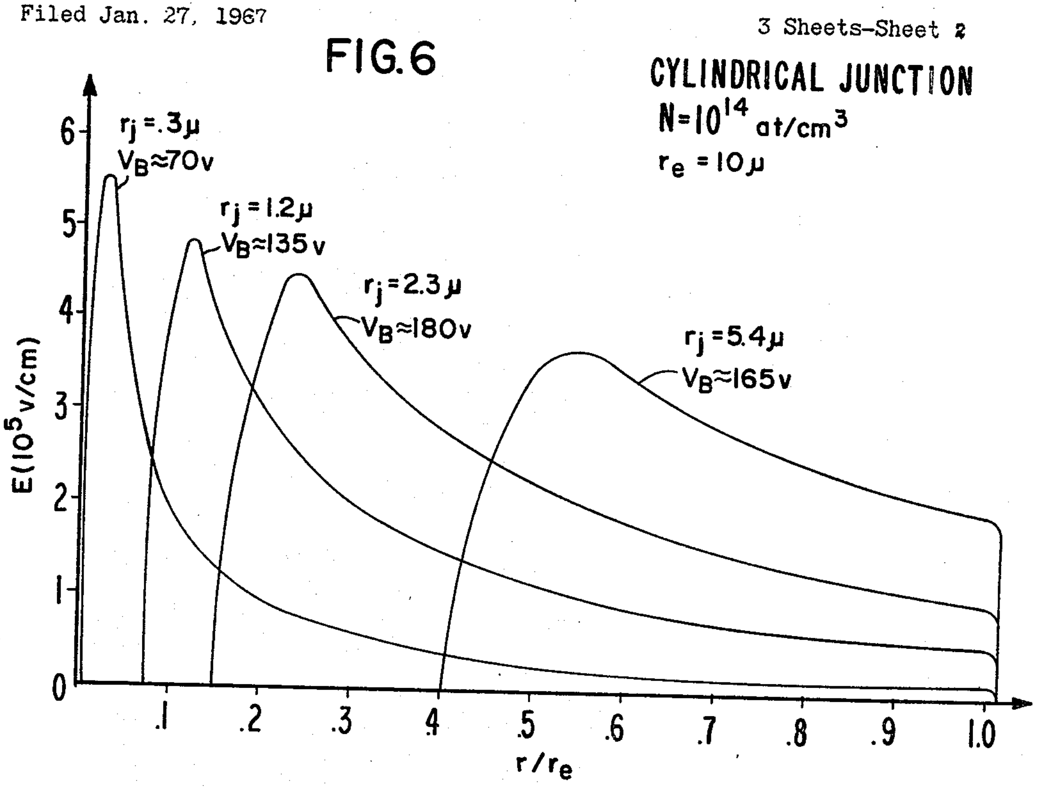
FIG. 6 is a family of curves illustrating the influence of the variation of the radius of curvature on the field distribution of the diode.

(2) The junction radius ($r_j$) determines the amount of field peaking as is apparent from FIG. 6. Avalanche breakdown occurs if the maximum field reaches a value of a few hundred kilovolts per centimeter, the exact value depending on details of the field distribution. A junction with a very small radius of curvature has a large amount of field peaking and therefore, breakdown is reached at a voltage where the field at the interface of regions 20 and 22 is still very low (see curve with $r_j=0.3$ micron in FIG. 6).

In order to maintain the maximum drift velocity of charge carriers, a field of about 20–30 kilovolts per centimeter is required. In order to allow for an A.C. voltage component (which leads to a proportional A.C. field component), the field at the interface of regions 20 and 22 should therefore be of the order of 50 to 100 kilovolts per centimeter. This is achieved if the ratio of $r_e$ to $r_j$ is of the order of 8:1 to 4:1. A too-large junction radius ($r_j$) gives only a small field enhancement and therefore, is not desirable (see curve with $r_j=5.4$ microns in FIG. 6). Using a ratio of 5:1 for $r_e:r_j$ leads to typical junction radii of 2 microns for 5 gHz., 1 micron for 10 gHz. and 0.5 micron for 20 gHz. using the above mentioned values of $r_e$.

(3) The limits on the doping density in region 22 can be determined approximately from the requirement that at the interface of regions 20 and 22, the field gradient will be largely determined by the junction curvature rather than by the impurity doping of region 22. This, then, also assures that the last term in Equation 2 can be neglected and Equation 3 can be used as an approximation. Taking the derivative of Equation 2 leads to the requirement that $$N < \frac{E(r_e)}{r_e}\frac{\epsilon}{q} \qquad (5)$$

Accordingly, for a value of $E(r_e)=5\cdot10^4$ volts per centimeter and the above mentioned values of $r_e$, the doping density in region 22 should be less than $3.3\cdot10^{14}$ atoms/cm.$^3$ for a 5 gHz. diode, less than $6.6\cdot10^{14}$ atoms/cm.$^3$ for a 10 gHz. diode and less than $1.3\cdot10^{15}$ atoms/cm.$^3$ for a 20 gHz. diode, etc. These densities correspond to resistivities of 15 ohms-centimeter, 7 ohms-centimeter, and 3.5 ohms-centimeter in the case of N-type material.

Figure 7:
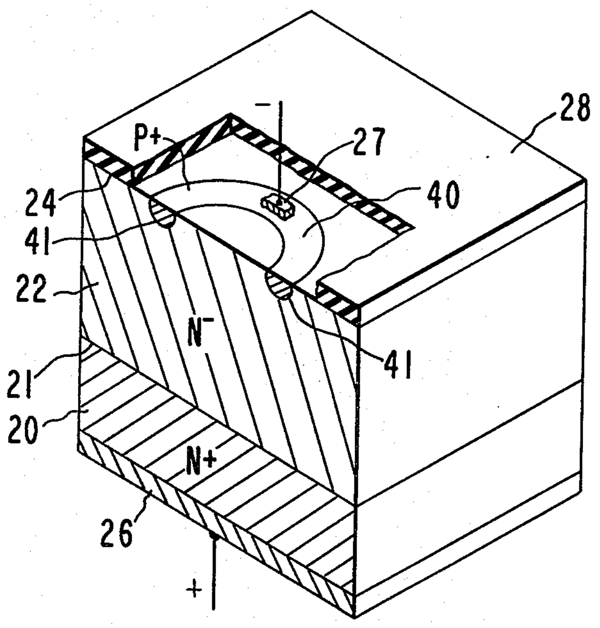
FIG. 7 is another embodiment of a diode according to the invention.

Although the device of FIG. 4 produces a usable negative resistance microwave diode, in the practical method of manufacturing such a diode, the ends (indicated generally by the reference numeral 37 in FIG. 4) of the semi-spherical shaped junction would also be slightly curved due to the diffusion process. Accordingly, it is quite conceivable that such a junction rather than breaking down along its curved surface 34 would tend to break down at its two ends since at these ends there would be greater concentration of the field. The result of such a device would be that the entire length of the semi-cylindrical junction would be inactive during breakdown and would again tend to merely add capacitive loading, although of a much smaller value than with a standard planar junction, to the diode. In order to avoid the possible problem of breakdown at the ends 37 of the semi-cylindrical junction, as shown in FIG. 7, the highly conductive P+ type conductivity region 33 of FIG. 4 may be replaced by a semi-toroidal region 40 which forms a similar shaped junction 41 with the region 22. Since such a junction has no ends, the problem of end breakdown is eliminated and, consequently, the entire surface of the junction will break down. Such a junction can be fabricated, as with the junction of FIG. 4, by diffusing the impurity through a very narrow circular slit in the conventional diffusion mask.

Figure 8:
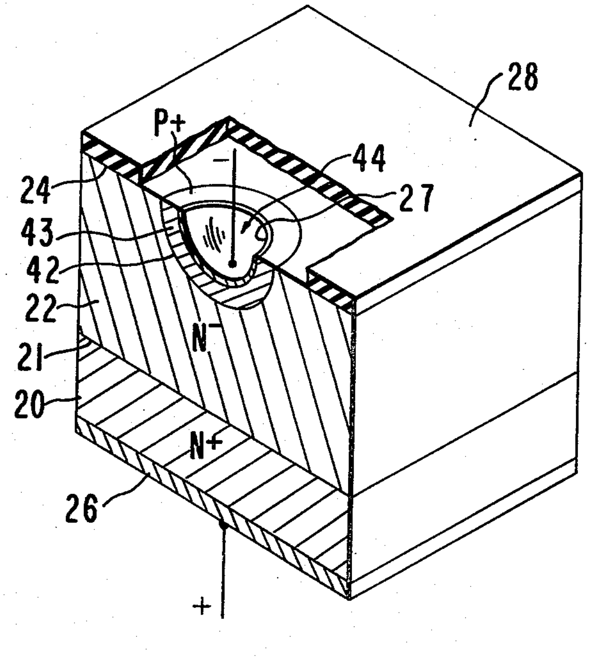
FIG. 8 is still another embodiment of a diode according to the invention.

As is evident from the above discussion, the functioning of the diode according to the invention is predicated on the idea that field enhancement for avalanche breakdown is achieved by providing the junction with a small radius of curvature. Although this end is attained by both the structures of FIG. 4 and FIG. 7, it should be noted that each of these junctions has a radius of curvature in only one dimension and, hence, there is only field enhancement in one direction. Accordingly, according to another embodiment of the invention, further field enhancement is attained by providing the junction with a radius of curvature in all directions. As shown in FIG. 8, such a configuration is attained by utilizing a hemi-spherical P–N junction 42 which is formed between a relatively high conductivity P-type region 43 and the relatively high resistivity region 22. Although a hemi-spherical junction can be formed by diffusing an impurity through a very small pinhole in a mask, as indicated, the junction 42 may also be formed by etching a hemi-spherical depression 44 in the surface of the layer 22 and then diffusing the P-type dopant into the layer 22 within the depression. A single circular hole in a mask may be used both for etching the depression 44 and for the diffusion of the impurity. This latter method of forming the hemispherical junction insures the formation of a generally more uniform spherical junction. It should be noted that the semi-cylindrical junction of FIG. 4, as well as the semi-toroidal junction of FIG. 7, may also be formed by this latter method if desired.

Turning now to the theoretical considerations of such a hemi-spherical junction, the solution of Poisson's equation, again for the region where $r$ (the radial distance from the center of the sphere) is less than $r_e$ and wherein the region 22 is of sufficiently high resistivity is as follows:

$$|E(r)| = \left[E(r_e) + \frac{2qN}{3\epsilon}r_e\right]\left(\frac{r_e}{r}\right)^2 - \frac{2qN}{3\epsilon}r \qquad (6)$$

$$\approx \left[E(r_e) + \frac{2qN}{3\epsilon}r_e\right]\left(\frac{r_e}{r}\right)^2 \qquad (7)$$

As is evident from Equations 6 and 7, the field in the depletion region is again a function of $r_e/r$, but in this case it is a function of the square of this relationship. Hence again, the field distribution of this diode structure is not dependent solely on the thickness of the high resistivity layer 22.

Figure 9:
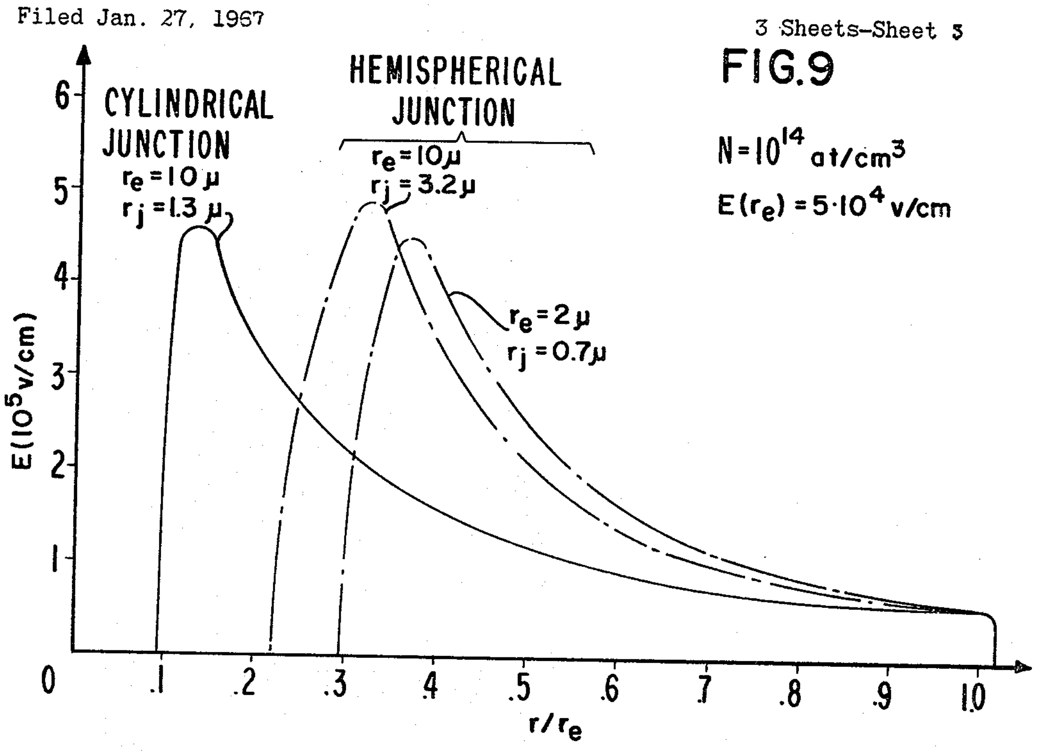
FIG. 9 is a family of curves showing the comparison between the field distributions obtained with the structures of FIGS. 4 and 8.

FIG. 9 shows a number of curves indicating a comparison between semi-cylindrical junctions and semi-spherical junctions. It is evident from the field distribution curves shown, that the practically available peaking for the spherical junctions is not as good as for the cylindrical junctions. This difference in the height of the curves may be attributed as a direct consequence of the two boundary conditions used [$E(r_j) < \sim 4\times10^5$ volts per centimeter, $E(r_e) < \sim 5\times10^4$ volts per centimeter]. However, it is also evident from the curves, that the required curvature to attain a desired peak height is considerably less than that required for the same peak height with a cylindrical junction. Accordingly, for the same reason it appears to be better for higher frequency devices.

It should be noted that in all the above discussions of the devices, it is assumed there is no field contribution due to surface charges at the silicon/silicon dioxide interface in the case of a silicon semiconductor device. However, in the case of a shallow $P^+N^-N^+$ diode according to the invention, the doner type surface states existing at the Si-$SiO_2$ interface will actually lead to a further field enhancement. Accordingly, in these diodes the advantageous field distribution is partially due to the curvature and partially to the surface charges.

The diodes described according to the invention provide a very simple structure for attaining the Read field type distribution. Moreover, as is obvious, manufacture of such diodes is much simpler than processes presently being used for planar Read type diodes and, moreover, lends itself to use of thinner high resistivity regions and, therefore, higher operating frequencies for the diodes.

Obviously, various other modifications of the invention are possible in light of the above disclosure. Accordingly, the invention is to be limited only as recited in the appended claims.

What is claimed is:

1. A negative resistance avalanche diode for use in a microwave circuit comprising:

a semiconductor wafer of relatively high conductivity and of a first conductivity type;

a layer of semiconductor material of said first conductivity type and having a high value of resistivity relative to that of said wafer overlying a major surface of said wafer, the exposed surface of said layer being substantially flat;

a highly conductive region of semiconductor material of the opposite conductivity type formed within said layer adjacent said surface, said region forming a P-N junction with said layer which extends to said surface, said junction having a small radius of curvature so that it concentrates the field at the junction, and a curved surface area which is large relative to the surface area of any plane portion thereof; and, means for making ohmic electrical contacts to said wafer and to said region, whereby when said diode is reverse biased, avalanche breakdown at said junction occurs and a negative resistance is produced at a frequency related to the transit time of carriers through the said high resistivity layer.

2. The diode of claim 1 wherein said radius of curvature is small relative to the thickness of said layer.

3. The diode of claim 2 wherein said radius of curvature is less than 4 microns.

4. The diode of claim 3 wherein said region is semicylindrical shaped.

5. The diode of claim 3 wherein said region is semitoroidal shaped.

6. The diode of claim 3 wherein said region is hemispherical shaped.

7. The diode of claim 2 wherein the conductivity type defining impurity concentration levels of said wafer and of said layer are between about $10^{16}$–$10^{20}$ atoms per cm.$^3$, and below $10^{16}$ atoms per cm.$^3$ respectively, and the surface concentration of the conductivity type defining impurity of said region is between about $10^{18}$–$10^{20}$ atoms per cm.$^3$.

8. The diode of claim 7 wherein the impurity concentration level of said layer is below a few times $10^{14}$ atoms per cm.$^3$.

9. The diode of claim 8 wherein said wafer and said region are of N-type conductivity and said region is of P-type conductivity.

10. The diode of claim 3 wherein the thickness $r_e$ of said layer is given by the equation $r_e \approx v_{max}/2f_0$ where $v_{max}$ is the maximum field-independent drift velocity of charge carriers in said layer, and $f_0$ is the desired operating frequency of said diode.

11. The diode of claim 10 wherein the ratio of the radius of curvature to the thickness of said layer is between approximately 1:4 to 1:8.

12. The diode of claim 11 wherein said layer has a thickness from between 2–30 microns.

13. The diode of claim 3 including a layer of insulating material overlying said exposed surface of said layer.

14. The diode of claim 13 wherein said semiconductor material is silicon and said insulating layer is an oxide of silicon.

15. A negative resistance avalanche diode for use in a microwave circuit comprising:

a highly conductive substrate of semiconductor material of a first conductivity type;

a highly resistive epitaxial layer of said first conductivity type formed on a surface of said wafer;

a highly conductive region of the opposite conductivity type formed within said layer adjacent the exposed surface thereof and forming a substantially curved P-N junction with said layer that extends to said exposed surface, said junction having a radius of curvature $r_j$ which is equal to or less than one-quarter the thickness $r_e$ of said layer, so as to cause a concentration of the electric field at the curved portion of the junction, said layer having a thickness $r_e$ given by the equation $r_e = v_{max}/2f_0$ where $v_{max}$ is the maximum, field-independent drift velocity of charge carriers in said layer, and $f_0$ is the desired operating frequency of said diode, so that when said diode is reverse biased into avalanche, the field distribution in said diode will be sharply peaked at said junction and then rapidly decay through said layer.

16. The diode of claim 15 wherein said layer has a conductivity type defining impurity concentration level of less than $10^{16}$ atoms per cm.$^3$.

17. The diode of claim 15 wherein said layer has a conductivity type defining impurity concentration level of less than a few times $10^{14}$ atoms per cm.$^3$.

References Cited

UNITED STATES PATENTS

| | | | |
|---|---|---|---|
| 3,270,293 | 8/1966 | De Loach et al. | 331—107 |
| 3,404,318 | 10/1968 | Lindmayer et al. | 317—234 |
| 3,365,627 | 1/1968 | Lindmayer et al. | 317—234 |
| 2,794,917 | 6/1957 | Shockley | 250—36 |
| 3,028,529 | 4/1962 | Belmont et al. | 317—234 |
| 3,217,215 | 11/1965 | Gault | 317—235 |
| 3,249,764 | 5/1966 | Holonyak | 307—88.5 |

JOHN W. HUCKERT, Primary Examiner

M. H. EDLOW, Assistant Examiner

U.S. Cl. X.R.

317—235; 331—107